United States Patent [19]

Maruichi

[11] Patent Number: 5,130,633
[45] Date of Patent: Jul. 14, 1992

[54] CIRCUIT FOR DETECTING AN EXCESS-DISCHARGE OF A BATTERY

[75] Inventor: Takanori Maruichi, Chiba, Japan

[73] Assignee: Sony Corporation, Tokyo, Japan

[21] Appl. No.: 570,544

[22] Filed: Aug. 21, 1990

[30] Foreign Application Priority Data

Sep. 11, 1989 [JP] Japan .................. 1-235299

[51] Int. Cl.⁵ .............................................. H02J 7/00
[52] U.S. Cl. .................................. 320/13; 340/636
[58] Field of Search .................. 320/13, 48; 340/636

[56] References Cited

U.S. PATENT DOCUMENTS

| | | | |
|---|---|---|---|
| 3,831,081 | 8/1974 | Weiss | 320/13 X |
| 3,863,128 | 1/1975 | Wilwerding | 320/21 |
| 3,979,657 | 9/1976 | Yorksie | 320/13 |
| 4,146,829 | 3/1979 | Rinaldi | 320/13 |
| 4,342,953 | 8/1982 | Collins | 320/13 |
| 4,412,156 | 10/1983 | Ota | 315/308 |

FOREIGN PATENT DOCUMENTS 2918960 11/1980 Fed. Rep. of Germany .

*Primary Examiner*—R. J. Hickey
*Attorney, Agent, or Firm*—Lewis H. Eslinger; Jay H. Maioli

[57] ABSTRACT

A circuit for controlling a load, such as lamp for a camera, so that the lamp can be turned ON and OFF in response to a low-power signal without requiring a relay, includes a detector for preventing the lamp from being powered when the DC voltage, as supplied by a battery, falls below an acceptable reference level. A completely transistorized circuit replaces the relay and includes a self-holding circuit. Low voltage detection is accomplished using a Zener diode to set the reference voltage.

5 Claims, 3 Drawing Sheets

CIRCUIT FOR DETECTING AN EXCESS-DISCHARGE OF A BATTERY

BACKGROUND OF THE INVENTION

1. Field of the Invention

The present invention relates generally to control circuits and, more particularly, to a circuit for detecting the discharge state, or voltage level, of a battery, so that a lamp can be appropriately turned ON or OFF.

2. Description of the Background

FIG. 1 shows a circuit useful in energizing a metal halide lamp such as used in a camera. In FIG. 1, a DC voltage Vcc is supplied across voltage source terminals 6 and 6' and such DC voltage source might comprise a secondary battery of the camera and consist of a nickel-cadmium battery or the like. The DC voltage Vcc supplied by the secondary battery is consumed by the load, so that the fluctuation in voltage at terminal 6 is relatively large.

The voltage across terminals 6 and 6' is connected through a power switch 21 to a fixed contact 22a of a switch 22 and to a closed or "make" contact 27a of a relay 27. A movable contact 22b of switch 22 is electrically connected to a movable contact 27b of relay 27, to one end of a relay drive coil 24, to a cathode of a reverse current blocking diode 23, and to an input terminal 25a of an integrated circuit (IC) that operates as a voltage detecting circuit 25. Voltage detecting circuit 25 supplies a high-level signal at an output terminal 25b thereof when the DC voltage applied to input terminal 25a is higher than a predetermined voltage level, and supplies a low level signal at output terminal 25b when the DC voltage Vcc is lower than the predetermined voltage level.

Output terminal 25b of voltage detecting circuit 25 is connected to the base of a switching transistor 26, whose collector is connected to an anode of diode 23 and to the other end of relay drive coil 24. The emitter of transistor 26 is connected to ground, and the movable contact 27b of relay 27 is connected to one side of a metal halide lamp 19 that comprises the load in the circuit. The other side of metal halide lamp 19 is connected to ground. The other contact 27c of relay 27 is the open or "break" contact.

In the operation of the above-described control circuit, if the metal halide lamp 19 is to be turned ON the power switch 21 is closed and the switch 22 is manually depressed to the closed state. Switch 22 is ON or closed only so long as it remains manually depressed. At that time, the magnitude of the voltage Vcc supplied from the DC voltage source to input terminal 25a of voltage detecting circuit 25 is detected thereby. If the detected voltage falls within a predetermined voltage range, voltage detecting circuit 25 generates a high-level voltage at output terminal 25b, thereby biasing the base of switching transistor 26 so that switching transistor 26 is turned ON. Thus, relay drive coil 24 is excited by voltage Vcc and movable contact 27b resting on break contact 27c is moved into contact with make contact 27a, whereby the voltage Vcc from voltage source terminal 6 is supplied to metal halide lamp 19. Therefore, metal halide lamp 19 is turned ON, and a current flows through relay drive coil 24 causing relay 27 to keep itself pulled in.

Under this condition, if the voltage Vcc from the DC voltage source decreases to the predetermined, minimum acceptable value, a low-level voltage will be developed at output terminal 25b of voltage detecting circuit 25, whereby switching transistor 26 is turned OFF and the current flowing through the relay drive coil 24 is interrupted. Thus, movable contact 27b of relay 27 will return to break contact 27c and relay 27 will be turned OFF. If relay 27 is released from the pulled in state, the power to lamp 19 is interrupted, which is the same as power switch 21 being turned OFF.

According to the above-described arrangement, metal halide lamp 19 must be turned ON and OFF by use of manual switch 22, and voltage detecting circuit 25 for detecting whether the voltage of the DC voltage source has fallen below a predetermined value must be formed of an integrated circuit, which results in an expensive control circuit. Furthermore, a relay must be controlled, which results in a control circuit that consumes more power than is desirable.

OBJECTS AND SUMMARY OF THE INVENTION

Accordingly, it is an object of the present invention to provide an improved circuit for detecting the level of discharge of a battery in which the aforenoted shortcomings and disadvantages inherent in previously proposed systems are eliminated.

More specifically, it is an object of the present invention to provide a circuit for detecting the discharge level of a battery and by which a load can be turned ON and OFF using a small amount of power.

It is another object of the present invention to provide a circuit for detecting the discharge level of a battery in which a fluctuation in the voltage from a power source can be automatically detected by a simplified circuit arrangement without using an expensive detecting circuit in the form of an integrated circuit.

According to one aspect of the present invention, a circuit for detecting the discharge level of a battery has a control signal connected to the base of a first transistor whose collector is connected to one electrode of a DC voltage source and whose emitter is connected through a capacitor to the base of a second transistor of the same polarity. The base of the second transistor is connected through a first resistor to the other electrode of the DC voltage source, the collector of the second transistor is connected to the base of a third transistor of opposite polarity, whose emitter is also connected to one electrode of the DC voltage source. The collector of the third transistor is connected through a series circuit of a second resistor and a reference voltage source to the other electrode of the DC voltage source. A junction between the second resistor and the reference voltage source is connected to the base of a fourth transistor of the same polarity as the first and second transistors, and the collector of the fourth transistor is connected through a third resistor to the collector of the third transistor. The collector of the fourth transistor is also connected through a fourth resistor to the base of the second transistor. The emitters of the second and fourth transistors are coupled together, and a junction therebetween is connected through a fifth resistor to the other electrode of the DC voltage source. In this circuit, the supply of current to a load is controlled by the third transistor, which is turned ON or OFF by a control signal supplied to its control signal input terminal. The third transistor is turned OFF when a voltage across the two electrodes of the DC voltage source becomes lower than a predetermined acceptable voltage, which is determined by the reference voltage source.

The above and other objects, features, and advantages of the present invention will become apparent from the following detailed description of a preferred embodiment to be read in conjunction with the accompanying drawings, in which like reference numerals are used to identify the same or similar elements in the several views.

DETAILED DESCRIPTION OF PREFERRED EMBODIMENTS

Figure 1:
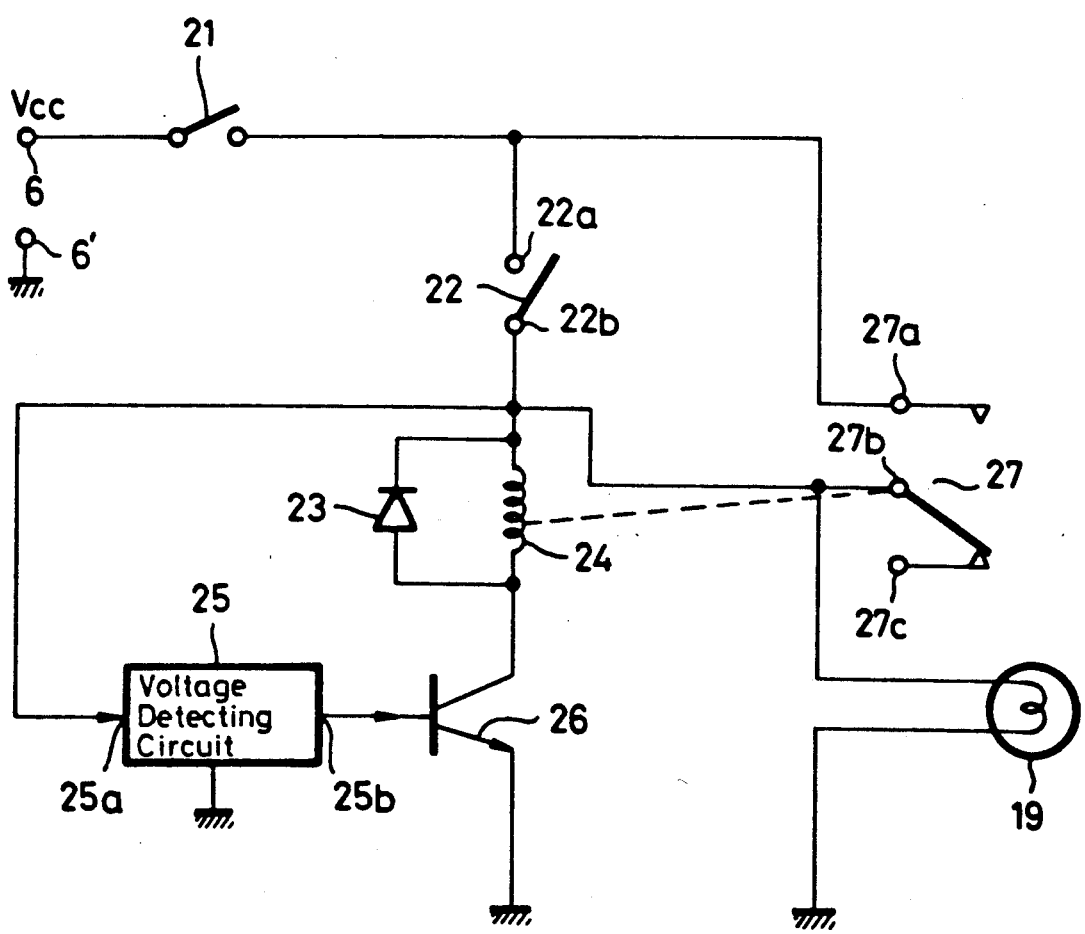
FIG. 1 is a schematic diagram showing an example of a previously proposed control circuit for a load.
Figure 2:
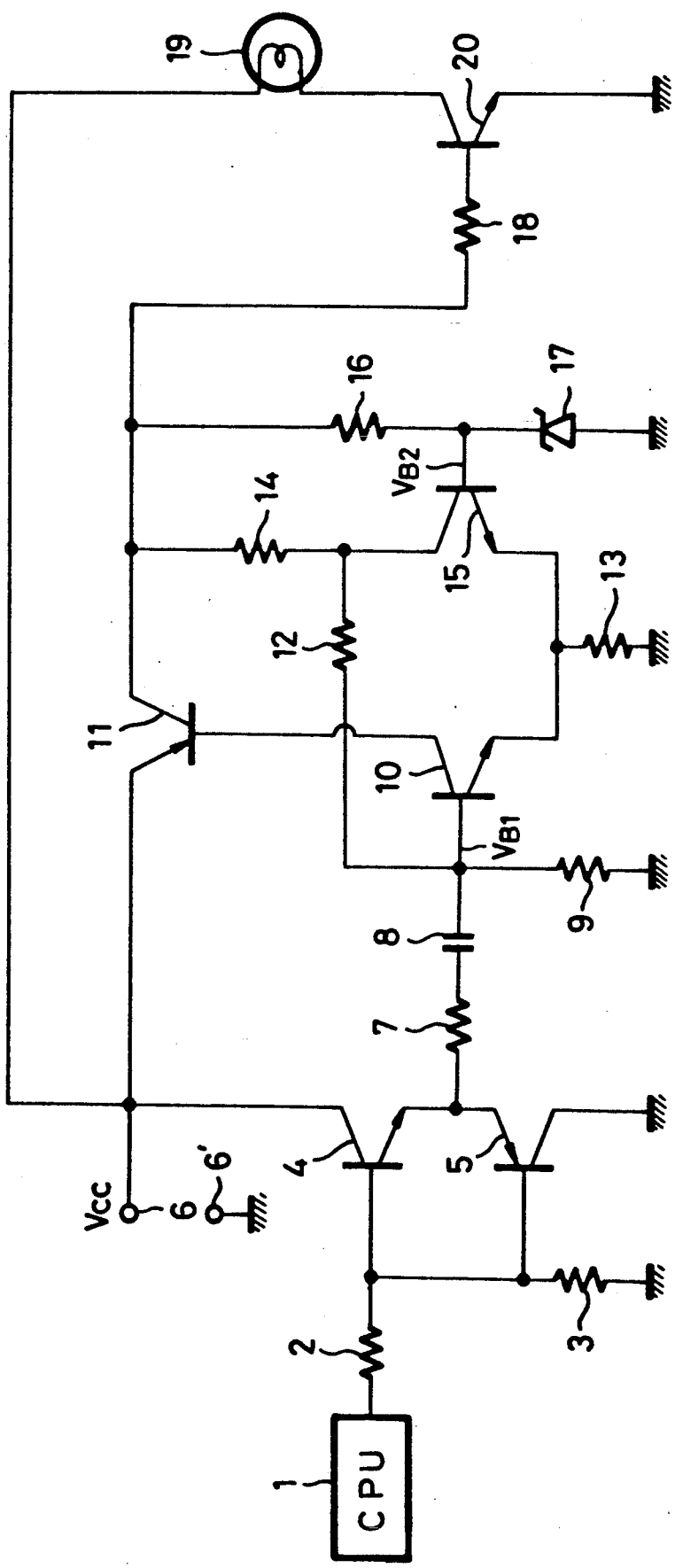
FIG. 2 is a schematic diagram of a circuit for detecting the discharge level of a battery according to a first embodiment of the present invention.

In the embodiment of FIG. 2, the control circuit of the present invention is used to control a metal halide lamp so that the metal halide lamp is properly turned ON and OFF. More particularly, the control circuit of this invention is used to control an illumination lamp or the like that is attached, for example, to a small-size video camera and that is driven by a secondary battery.

Referring to FIG. 2, a microcomputer comprises a control apparatus for the camera, and this microcomputer is more aptly referred to as a central processing unit (CPU)

A control signal from CPU 1 is supplied through a resistor 2 to the bases of npn and pnp transistors 4 and 5, respectively. A junction between the base of transistors 5 and resistor 2 is connected to ground via a resistor 3. The collector of npn transistor 4 is connected to a voltage source terminal 6 to which a DC voltage Vcc is applied, with terminal 6' being connected to the other side of the DC voltage source. The emitter of npn transistor 4 and the emitter of pnp transistor 5 are coupled together, and the collector of pnp transistor 5 is connected to ground. The junction of the emitter of npn transistor 4 and the emitter of pnp transistor 5 is connected to the base of an npn transistor 10 via a series circuit consisting of a resistor 7 and a capacitor 8. The collector of npn transistor 10 is connected to the base of a pnp transistor 11, and the emitter of npn transistor 10 is coupled to the emitter of an npn transistor 15. The junction between the emitters of npn transistors 10 and 15 is connected to ground via a resistor 13. The emitter of pnp transistor 11 is connected to voltage source terminal 6, to which the DC voltage Vcc is applied. The collector of pnp transistor is connected through a resistor 18 to the base of an npn transistor 20. The collector of npn transistor 15 is connected through a resistor 14 to the collector of pnp transistor 11 and through a resistor 12 to the base of npn transistor 10. The base of npn transistor 10 is connected to ground via a resistor 9. The base of npn transistor 15 is connected through a resistor 16 to the collector of pnp transistor 11 and through a Zener diode 17 to ground. The Zener voltage of Zener diode 17 comprises the reference voltage that is selected to be such that when the DC voltage Vcc at the voltage source terminal 6 is lower than a predetermined voltage, transistor 15 is turned ON. The collector of npn transistor 20 is connected to one terminal of a metal halide lamp 19 and the other terminal of lamp 19 is connected to voltage source terminal 6. The emitter of npn transistor 20 is connected to ground.

In the operation of the above-described control circuit of FIG. 2, when an operation signal consisting of a positive polarity pulse from CPU 1 is delivered through resistor 2, the base of npn transistor 4 is biased so that the voltage Vcc is applied from voltage source terminal 6 through resistor 7 and capacitor 8 to the base of npn transistor 10. Therefore, a voltage $V_{B1}$ at the base of npn transistor 10 goes to a higher level and npn transistor 10 is turned ON. The collector voltage of npn transistor 10 makes the base voltage of pnp transistor 11 lower in level than before transistor 10 was turned ON, and pnp transistor 11 is then also turned ON. As a result, a self-holding circuit is formed by a loop of the emitter and collector of pnp transistor 11, resistor 14, resistor 12 and the base of npn transistor 10, whereby the ON-state of npn transistor 10 is maintained. Accordingly, the ON-state of pnp transistor 11 is maintained so that the voltage Vcc at voltage source terminal 6 is supplied through pnp transistor 11 and base resistor 18 to the base of npn transistor 20, whereby npn transistor 20 is turned ON. Transistors 4 and 5 act as a buffer circuit.

Therefore, the voltage Vcc from voltage source terminal 6 is supplied to metal halide lamp 19 via a loop formed of metal halide lamp 19, the collector and emitter of npn transistor 20, the ground return, and the DC voltage source, in that order, whereby metal halide lamp 19 is turned ON. In this state, a base voltage $V_{B2}$ of npn transistor 15 is smaller than the base voltage $V_{B1}$ of npn transistor 10, such that an inequality of $V_{B1} > V_{B2}$ is established, and the result is that the circuit is in a stable condition.

When an operation signal consisting of a negative polarity pulse from CPU 1 is delivered through resistor 2 as a control signal, npn transistor 10 is turned OFF via npn and pnp transistors 4 and 5, form the buffer circuit, so that pnp transistor 11 is also turned OFF. This results in npn transistor 20 being turned OFF to prevent the voltage Vcc of voltage source terminal 6 from being supplied to the metal halide lamp 19, thus the load is blocked from its voltage source.

When the voltage Vcc from a voltage source, such as the secondary battery or the like, as applied to voltage source terminal 6 becomes lower than the predetermined voltage level because of the discharge of the battery, the base potential or voltage $V_{B2}$ of npn transistor 15, as determined by Zener diode 17, becomes larger than the base potential or voltage $V_{B1}$, resulting in $V_{B1} < V_{B2}$. This has the effect that npn transistor 10 is turned OFF, while the voltage of npn transistor 15 is maintained as the potential of the reference voltage source 17 and npn transistor 15 is turned ON.

More specifically, the base voltage of npn transistor 10 is applied through resistor 12 to the collector of npn transistor 15 so that, when $V_{B1} = V_{B2}$, the base potential $V_{B1}$ of npn transistor 10 is lowered with an increasing speed and npn transistor 10 is immediately turned OFF. Consequently, pnp transistor 11 is also turned OFF and npn transistor 20 is turned OFF, thereby inhibiting the supply of the voltage Vcc to metal halide lamp 19.

In the above-described circuit arrangement, npn transistor 5 might be thought of as a switching transistor that discharges voltages accumulated in capacitor 8 when the voltage Vcc of voltage source terminal 6 is opened or when the operation signal of negative polarity pulse is supplied from CPU 1.

Thus, in the control circuit of the present invention embodied as described above, metal halide lamp 19 can be turned ON and OFF by a very low power pulse signal from CPU 1 and a voltage drop of the voltage level Vcc supplied at voltage source terminal 6 can be detected, thereby quickly interrupting the supply of the voltage to the load without requiring a relay.

Figure 3:
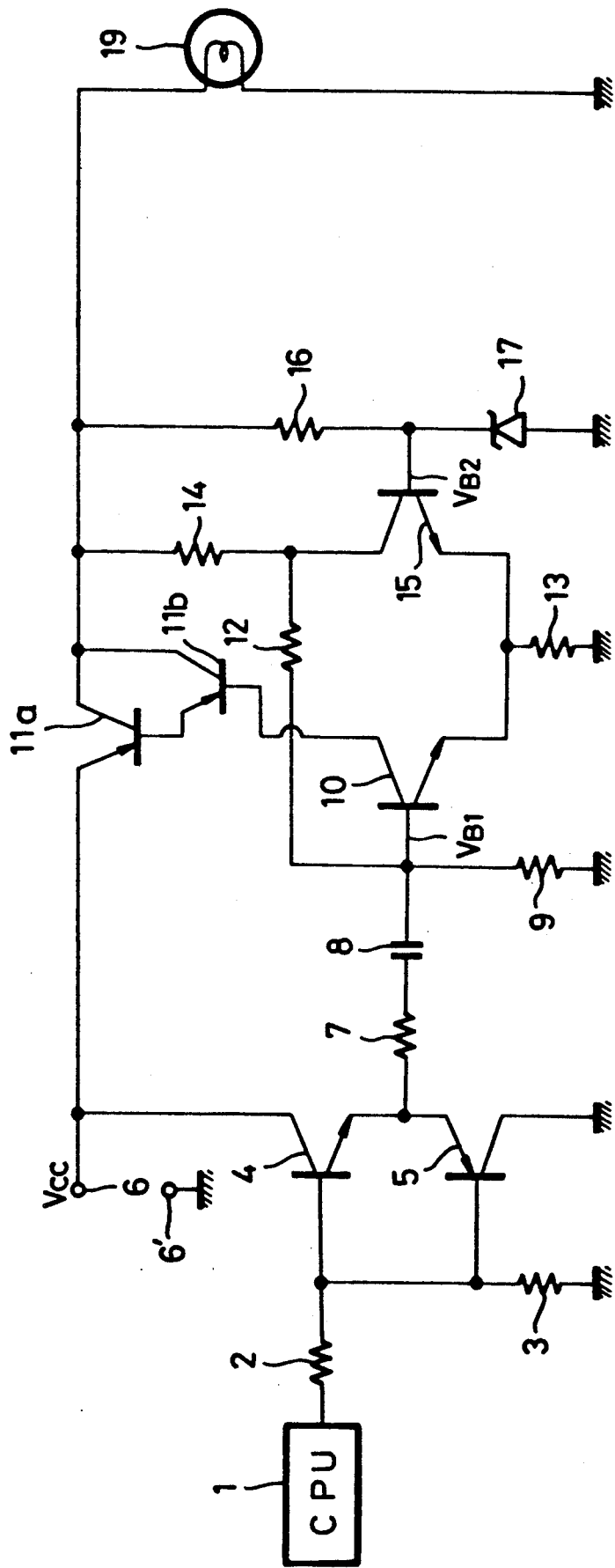
FIG. 3 is a schematic diagram of a circuit for detecting the discharge level of a battery according to a second embodiment of the present invention.

FIG. 3 is a second embodiment of a circuit for detecting the discharge level of a battery according to the present invention. In FIG. 3, like parts corresponding to those of FIG. 2 are marked with the same reference numerals and ar not described in detail. In the arrangement of FIG. 3, metal halide lamp 19 is again provided as the load but is directly driven without the additional transistor, as in the embodiment of FIG. 2.

In FIG. 3, the pnp transistor (11) that was provided in the embodiment of FIG. 2 is formed of two transistors 11a and 11b, which are Darlington-connected. The emitter of transistor 11a is connected to Vcc voltage source terminal 6, and the collector of transistor 11a and the collector of transistor 11b are connected together to one terminal of metal halide lamp 19. The other terminal of metal halide lamp 19 is connected to ground, as is the other terminal 6' to which the DC voltage source is connected. The emitter of transistor 11b is connected to the base of transistor 11a, and the base of transistor 11b is connected to the collector of npn transistor 10, as in the well-known Darlington configuration. The remaining circuit elements in the embodiment of FIG. 3 are the same as the circuit of FIG. 2.

In accordance with this second embodiment of the present invention shown in FIG. 3, when npn transistor 10 is turned ON, the Darlington-connected transistors 11a and 11b are turned ON, whereby the voltage Vcc applied to voltage source terminal 6 is directly supplied to the load, that is, to metal halide lamp 19. Therefore, the ON and OFF state of the load circuit can be directly controlled by a low-power control signal, such as might be provided by a microcomputer or CPU 1.

Although a metal halide lamp is shown as the load in the above-described embodiments, the metal halide lamp can be replaced with other loads, such as a resistor, a motor, and the like.

According to the circuit provided by the present invention for detecting an excessive discharge of a battery, and an attendant decrease in voltage, the load is not controlled by the operation of a relay and the load can be controlled solely by a low-power control signal from a CPU or the like. Further, a detecting circuit based on an expensive IC is not required to detect a drop in the DC voltage level and fluctuations of such DC voltage can be automatically detected by a relatively simple circuit.

Having described preferred embodiments of the invention with reference to the accompanying drawings, it is to be understood that the invention is not limited to those precise embodiments and that various changes and modifications could be effected by one skilled in the art without departing from the spirit or scope of the novel concepts of the invention, as defined in the appended claims.

What is claimed is:

1. A circuit for detecting a decrease in voltage level of a DC voltage source supplying current to a load and receiving a load control signal, said circuit comprising:
    first, second, third and fourth transistors (4, 10, 11, 15) each having an emitter, a collector and a base;
    first, second, third, fourth and fifth resistors (9, 16, 14, 12, 13);
    a capacitor (8); and
    a reference voltage device (17);
    said second resistor (16) and said reference voltage device (17) forming a series circuit;
    said first transistor (4) being of a first polarity and having the control signal connected to the base thereof, the collector of said first transistor being connected to one electrode of the DC voltage source, said second transistor (10) being of said first polarity, the emitter of said first transistor being connected through said capacitor (8) to the base of said second transistor (10), the base of said second transistor being connected through said first resistor (9) to the other electrode of said DC voltage source, said third transistor (11) being of a second polarity, the collector of said second transistor being connected to the base of said third transistor (11), the emitter of said third transistor being connected to said one electrode of said DC voltage source, the collector of said third transistor being connected through said series circuit of said second resistor (16) and said reference voltage device (17) to said other electrode of said DC voltage source, said fourth transistor being of said first polarity, a junction between said second resistor and said reference voltage device being connected to the base of said fourth transistor (15), the collector of said fourth transistor being connected through said third resistor (14) to the collector of said third transistor, the collector of said fourth transistor being connected through said fourth resistor (12) to the base of said second transistor, the emitter of said second and fourth transistors being coupled together, and there being a junction therebetween connected through said fifth resistor (13) to the other electrode of said DC voltage source, the supply of current to the load being controlled by said third transistor (11), said third transistor being turned ON or OFF by the control signal, and said third transistor being turned OFF when a voltage source becomes lower than a predeermined voltage source becomes lower than a predetermined voltage determined by said reference voltage device (17).

2. The circuit according to claim 1 in which said reference voltage device comprises a Zener diode.

3. The circuit according to claim 1 in which said load circuit comprises a metal halide lamp.

4. The circuit according to claim 1 in which said third transistor comprises a Darlington-connected pair of transistors and further comprising a sixth transistor (11a) forming part of the Darlington-connected transistors, the emitter of said third transistor being connected to said one electrode of said DC voltage source through a base-emitter path of said sixth transistor (11a).

5. The circuit according to claim 1 further comprising a seventh transistor (5) whose collector is grounded, whose base is supplied with said control signal, and whose emitter is connected to the emitter of said first transistor (4), thereby to selectively discharge said capacitor (8).

* * * * *